United States Patent [19]

Miles et al.

[11] Patent Number: 4,916,516

[45] Date of Patent: Apr. 10, 1990

[54] SEMICONDUCTOR CONTACT ARRANGEMENT

[75] Inventors: Clifford V. H. Miles, Bath; Patrick L. T. Bishop, Chippenham, both of England

[73] Assignee: Westinghouse Brake and Signal Company Limited, Wiltshire, United Kingdom

[21] Appl. No.: 271,632

[22] Filed: Nov. 16, 1988

[30] Foreign Application Priority Data

Dec. 10, 1987 [GB] United Kingdom ............... 8728878

[51] Int. Cl.$^4$ .................... H01L 23/48; H01L 29/44; H01L 29/52
[52] U.S. Cl. ......................................... 357/68; 357/65
[58] Field of Search .................................. 357/68, 65

[56] References Cited

U.S. PATENT DOCUMENTS

| 3,462,349 | 8/1969 | Gorgeryi | 357/68 |
| 3,753,053 | 8/1973 | Swartz | 357/69 |
| 3,781,977 | 1/1974 | Hulmes | 357/68 |
| 3,783,348 | 11/1974 | Swartz et al. | 357/68 |
| 3,831,068 | 8/1974 | Kriepkamp | 357/68 |
| 3,912,852 | 10/1975 | Simon | 357/70 |
| 4,173,768 | 11/1979 | Denlinger et al. | 357/68 |

Primary Examiner—Andrew J. James
Assistant Examiner—Viet Q. Nguyen
Attorney, Agent, or Firm—Marshall, O'Toole, Gerstein, Murray & Bicknell

[57] ABSTRACT

A semiconductor contact arrangement comprising a semiconductor wafer having on one of its major faces an area of one type of conductivity and an electrical contact in face-to-face engagement with that area, in which the contact is located with respect to that area and is secured to the sandwich by a stud welded to the wafer and projecting into a hole extending through the contact from the face thereof engaged with the wafer.

8 Claims, 1 Drawing Sheet

SEMICONDUCTOR CONTACT ARRANGEMENT

FIELD OF THE INVENTION

This invention relates to contact arrangements for semiconductor devices.

DESCRIPTION OF THE RELATED ART

As is well known, semiconductor devices comprise a wafer of semiconductor material on the opposed major faces of which emerge zones of differing-type conductivity as areas of conductivity-type. These areas are a face-to-face engagement with generally-planar shaped contacts. The sandwich thus formed by the wafer contact assembly is then encapsulated in a housing. However, prior to encapsulation, the sandwich, of necessity, has to be handled for a variety of treatments including ultimately, encapsulation.

The conductivity-type areas of semiconductor wafers have become of even more sophisticated shape to achieve required characteristics of the ultimate device. With this increasing sophistication of shape of the wafer areas, the associated contact has, necessarily, also become of increasing sophistication of shape with resultant problems of orientation and location of the contact relative to the area to avoid short-circuiting of the p-n junction defined by the area. These problems are the more great with the more complex devices such as thyristors, transistors and GTO devices.

In spite of this increasing sophistication over the past decades and the attendant problems of relative location, the securing in position of a contact when properly located relative to its associated area has traditionally and by all semiconductor manufacturers, been achieved by glueing the contact to the wafer with rubber/resin glues and many such glues have been tried. However, these glues can creep between the contact and the wafer—preventing subsequent effective electrical connection—and, at least with certain glues they can effect the lifetime of the device.

It is not feasible to weld the contacts in position for the weld would provide a preferential electrical path which would negate the whole purpose of an area contact which is to ensure spread of the current through the area/contact over substantially the whole of the face-to-face engaged area.

The present invention seeks to overcome the problems inherent in the traditional method of securing contacts to the wafer.

SUMMARY OF THE INVENTION

Accordingly, the present invention provides a semiconductor contact arrangement comprising a semiconductor wafer having on one of its major faces an area of one type of conductivity and an electrical contact in face-to-face engagement with that area, in which the contact is located with respect to that area and is secured to the sandwich by a stud welded to the wafer and projecting into a hole extending through the contact from the face thereof engaged with the wafer.

The stud may be encircled by a sleeve of electrically insulating material whereby the stud is electrically insulated from the contact.

Conveniently, the stud may have been formed from a ball of material weldable to the area of the sandwich, the ball having been previously positioned in the hole and the ball in the subsequent welding of it to the area forming the stud.

Where the stud is encircled by a sleeve of electrically insulating material whereby the stud is electrically insulated from the contact, the sleeve may be button-shaped and secured to the area of the sandwich by the stud extending through the hole. The sleeve may have therein more than a single hole and the stud then be constituted by a length of wire which passes through two of the holes in the sleeve and is welded to the area of the area of the sandwich at each end of the length of wire.

Alternatively, the stud may have a head and a shank, the head being larger in cross-sectional area than the shank.

The hole in the contact may be formed by etching of the contact during or after the shaping of the contact or by machining.

BRIEF DESCRIPTION OF THE DRAWING

Embodiments of the present invention will now be described in greater detail, by way of example only, with reference to the accompanying drawing of which.

DESCRIPTION OF THE PREFERRED EMBODIMENT(S)

Figure 1:
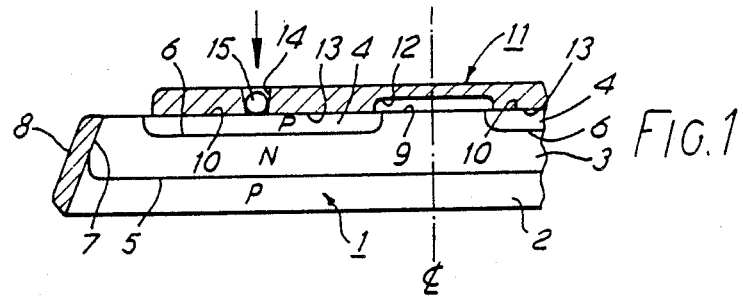
FIG. 1 shows a cross-sectional view of a part of a semiconductor sandwich.

Referring, firstly, to FIG. 1, the semiconductor wafer 1 incorporates P and N regions 2, 3 and 4 between which are PN junctions 5 and 6. The edge 7 of the wafer 1 is chamfered and then covered by electrical insulating material 8.

The regions 4 terminate on the upper major face 9 of the wafer 1 in areas 10.

A contact 11 is mounted on the upper face 9 of the wafer 1. The lower face 12 of the contact 11 is mesa-etched to provide areas 13 of the contact 11 which are of complementary shape and similar size to the areas 10 of the face 9 of the wafer 1.

The contact 11 is provided with two or three (of which one only is shown) holes 14. It will be noted that these holes 14 are conical-shaped with the smaller diameter being at the end of the hole adjacent the wafer 1.

Positioned in the holes 14 is an aluminium ball 15.

The contact 11 is secured to the wafer 1 and its areas 13 held correctly located with respect to the areas 10 of the wafer 1, by welding the ball 15 to the area 10. In the course of so welding, the ball 15 will be formed into a stud which will, at least in part, take up the shape of the hole 14. The stud thus formed will both secure the contact 11 to the wafer 1 and keep it properly aligned with respect thereto. The thus-assembled sandwich will be readily handleable without risk of the contact 11 being disturbed relative to the wafer 1 and the sandwich can be further treated as may be necessary and can be encapsulated in conventional ways.

It will be noted that welding of the ball 15 to the wafer 1 will ensure that the thus-formed stud does not stand proud of the top surface of the contact 11. Thus, in encapsulation, the surface of the housing contact engageable with the top surface of contact 11 can be planar.

It may be found that the ball 15 when deformed by welding to form the stud does not make sufficiently good electrical connection with the contact 11 as to provide an unacceptably-good preferential electrical path as seriously to effect the operating characteristics of the ultimate device. If so, then plain aluminium ball can be used.

Should this not be so and a plain aluminium ball does provide such an unacceptable-good preferential path, then a sleeve of insulating material can be positioned between the ball 15 and the hole 14.

In an alternative, instead of the ball 15, there may be used a short length of aluminium wire. In this case, any necessary electrical insulation of the formed stud from the contact 11 may be provided either by a sleeve of insulating material encompassing the aluminium wire or by an insulating coating on the wire.

Figure 2:
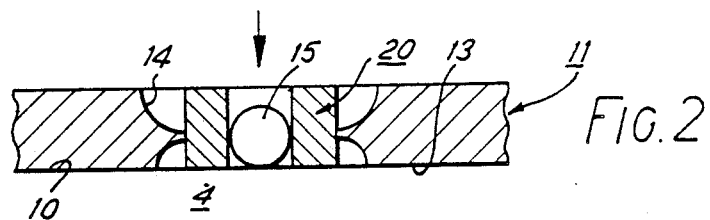
FIGS. 2 to 5 show fragmentary cross-sectional views on an enlarged scale of alternative constructions for locating and securing the contact to the wafer.

In the first illustrated alternative construction shown in FIG. 2, the ball 15 is enclosed in an electrically-insulating sleeve 20 as suggested above. In FIG. 1, the hole 14 was of conical shape and may have been formed by machining. In FIG. 2, the hole 14 has been formed at the same time as the shaping of the contact 11 by etching from both sides of the contact 11. The thus-formed hole 14 will have a shape somewhat as illustrated—in particular, a shape which will cause the sleeve 20 when deformed by the welding of the ball 15 to the wafer 1 to form the stud, to hold the contact 11 against movement relative to the wafer 1.

Figure 3:
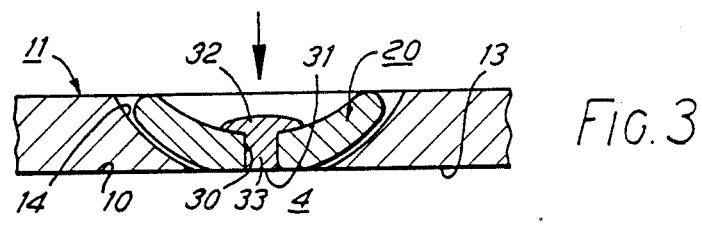

In the FIG. 3 alternative, the hole 14 has been formed by etching from the top side only of the contact 11 thus forming a generally bowl-shaped hole. In this alternative, the sleeve 20 is generally button-shaped with a single central hole 30. Through the hole 30 was inserted a short length of aluminium wire which was subsequently welded to the wafer 1 at 31. In so doing, a head 32 was formed on the thus-formed stud, the head 32 being of greater cross-sectional than the shank 33 and thus fixing the sleeve 20 to the wafer 1.

Figure 4:
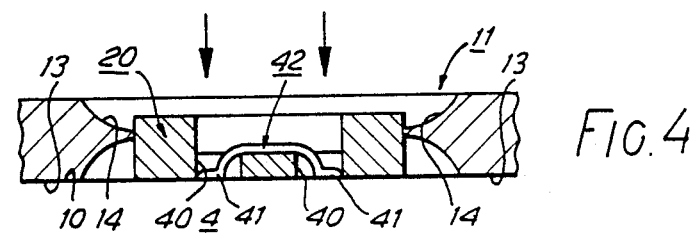

In FIG. 4, the sleeve 20 is again button-shaped but in this alternative, the sleeve 20 has a pair of holes 40. In this case, the stud was formed by welding each end 41 of a length of aluminium wire 42 to the wafer 1, the wire bridging that part of the sleeve 20 between the two holes 40. In this alternative, the hole 14 has again been formed by etching in from both sides of the contact 11. Thus, in welding the wire 42 to the wafer 1, the sleeve 20 will be deformed to grip the wall of the hole 14 and thus firmly locate the contact 11 on the wafer 1.

Figure 5:
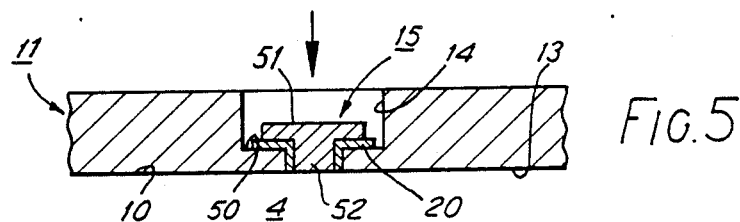

In FIG. 5, the hole 14 has been shaped by machining to provide a shoulder 50. In this case, the stud 15 initially had a head 51 and a shank 52—the head 51 being of greater cross-sectional dimensions than the shank 52. The sleeve 20 is of complementary shape to the stud 15. Thus, when the stud 15 is welded by the lower end of its shank 52 to the wafer 1, the head 51, through the sleeve 20, will engage the shoulder 50 in the hole 14 and, again, serve to secure the contact 11 on the wafer 1.

Clearly there are many other alternative constructions than those here illustrated and described and many other alternative shapes of and methods of forming a suitable stud.

Further, the stud may be pre-welded to the wafer 1. In this case, the contact 11 would later be positioned on the wafer 1 - the pre-welded stud then acting to locate the wafer. After location of the contact, the stud could then be pressure-deformed to effect receiving of the contact 11 to the wafer 1.

In all of the above described embodiments, the stud is formed in the area of the wafer electrically to be contacted by the contact. However, the stud can equally well be provided in some other area of the wafer so long as the stud is electrically-insulated from the contact 11.

We claim:

1. A semiconductor contact arrangement comprising:
   (a) a semiconductor wafer having first and second major faces, said wafer having on one of said faces an area of a given conductivity type;
   (b) a generally planar electrical contact having a face in direct engagement with said area to form a sandwich, said contact defining a hole extending through the contact from said area;
   (c) a stud welded on to said area, said stud projecting into said hole to locate said contact on said wafer and secure said contact to said wafer.

2. An arrangement as claimed in claim 1, wherein the stud is encircled by a sleeve of electrically insulating material whereby the stud is electrically insulated from the contact.

3. An arrangement as claimed in claim 1, wherein said stud has been formed from a ball of material weldable to said area, said ball having been positioned in said hole and subsequently welded to said area to form said stud.

4. An arrangement as claimed in claim 2, wherein the sleeve is button-shaped and is secured to said area by the stud extending through the hole.

5. An arrangement as claimed in claim 4, wherein the sleeve has therein more than a single hole and the stud is constituted by a length of wire which passes through two of the holes in the sleeve and is welded to said area at each end of the length of wire.

6. An arrangement as claimed in claim 2, wherein the stud has a head and a shank, the head being larger in cross-sectional area than the shank.

7. An arrangement as claimed in claim 1, wherein the hole in the contact has been formed by etching of the contact during or after the shaping of the contact.

8. An arrangement as claimed in claim 1, wherein the hole in the contact has been formed by machining.

* * * * *